United States Patent
Nomura et al.

(10) Patent No.: US 10,848,115 B2
(45) Date of Patent: Nov. 24, 2020

(54) CHOPPER STABILIZED AMPLIFIER

(71) Applicant: ROHM CO., LTD., Kyoto (JP)

(72) Inventors: Naohiro Nomura, Kyoto (JP); Takatoshi Manabe, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 8 days.

(21) Appl. No.: 16/351,980

(22) Filed: Mar. 13, 2019

(65) Prior Publication Data
US 2019/0288656 A1 Sep. 19, 2019

(30) Foreign Application Priority Data

Mar. 19, 2018 (JP) .................................. 2018-050856

(51) Int. Cl.
*H03F 1/02* (2006.01)
*H03F 3/45* (2006.01)

(52) U.S. Cl.
CPC ..... *H03F 3/45744* (2013.01); *H03F 3/45636* (2013.01)

(58) Field of Classification Search
CPC ........... H03F 1/02; H03F 1/0205; H03F 3/005
USPC ............................................... 330/9; 327/124
See application file for complete search history.

(56) References Cited

U.S. PATENT DOCUMENTS

2007/0236285 A1* 10/2007 Felder .................... H03K 5/249 330/9
2015/0229278 A1* 8/2015 Ivanov ................ H03F 3/45968 330/9

FOREIGN PATENT DOCUMENTS

JP 2017076942 A 4/2017

OTHER PUBLICATIONS

Reza Moghimi, "To Chop or Auto-Zero: That Is the Question," Analog Services, Technical Article MS-2061; Jun. 2011, p. 1-6.

* cited by examiner

*Primary Examiner* — Steven J Mottola
(74) *Attorney, Agent, or Firm* — Cantor Colburn LLP

(57) ABSTRACT

There is provided a chopper stabilized amplifier with an input bias current reduced. The chopper stabilized amplifier includes a main amplifier and a correction circuit. The correction circuit includes a second gm amplifier of a full differential type. A first selector and the second gm amplifier are coupled to each other without DC blocking capacitors. The differential input state of the second gm amplifier is configured with a depletion-type transistor.

10 Claims, 12 Drawing Sheets

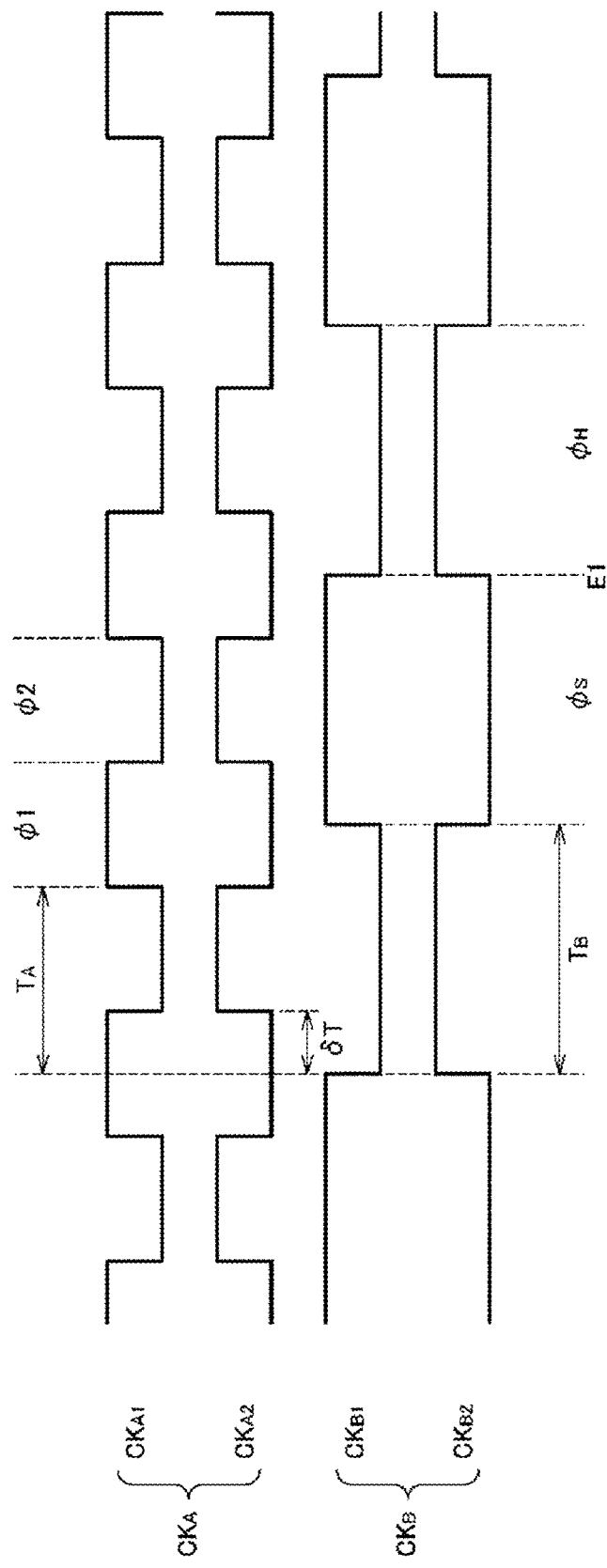

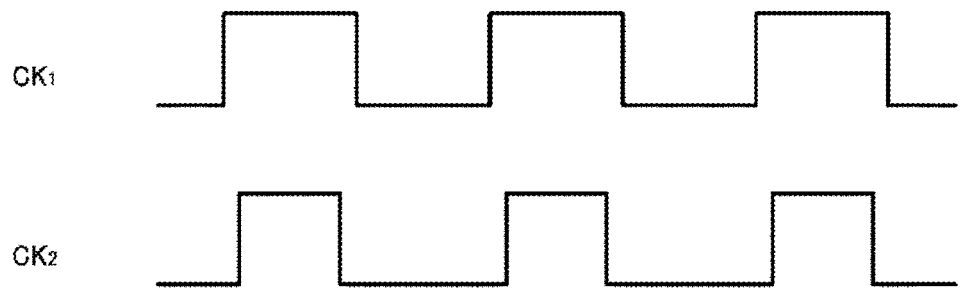
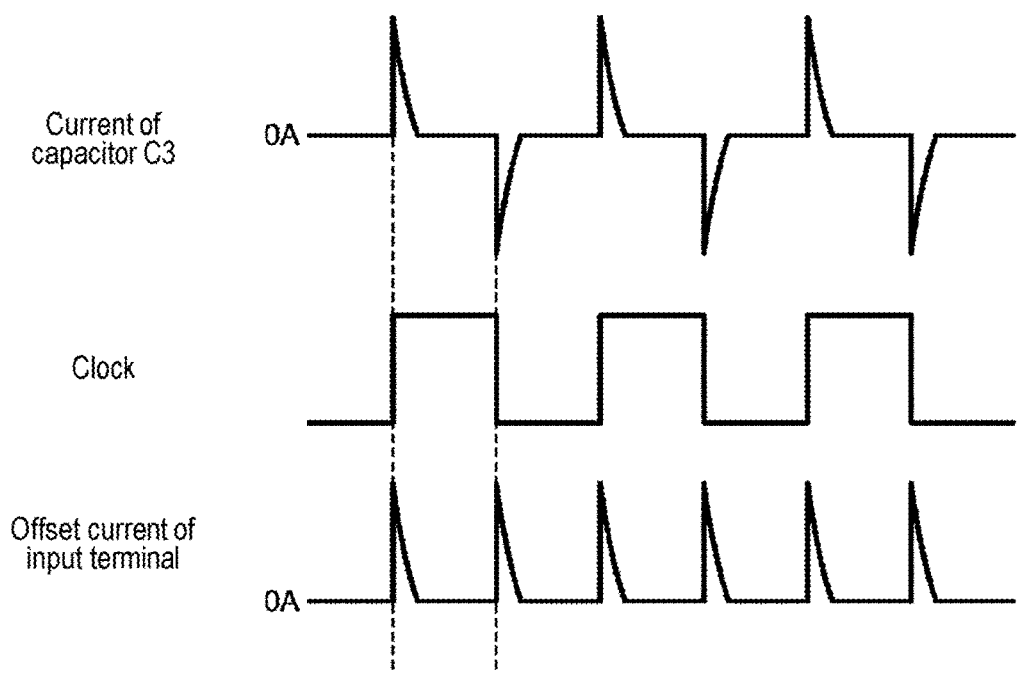

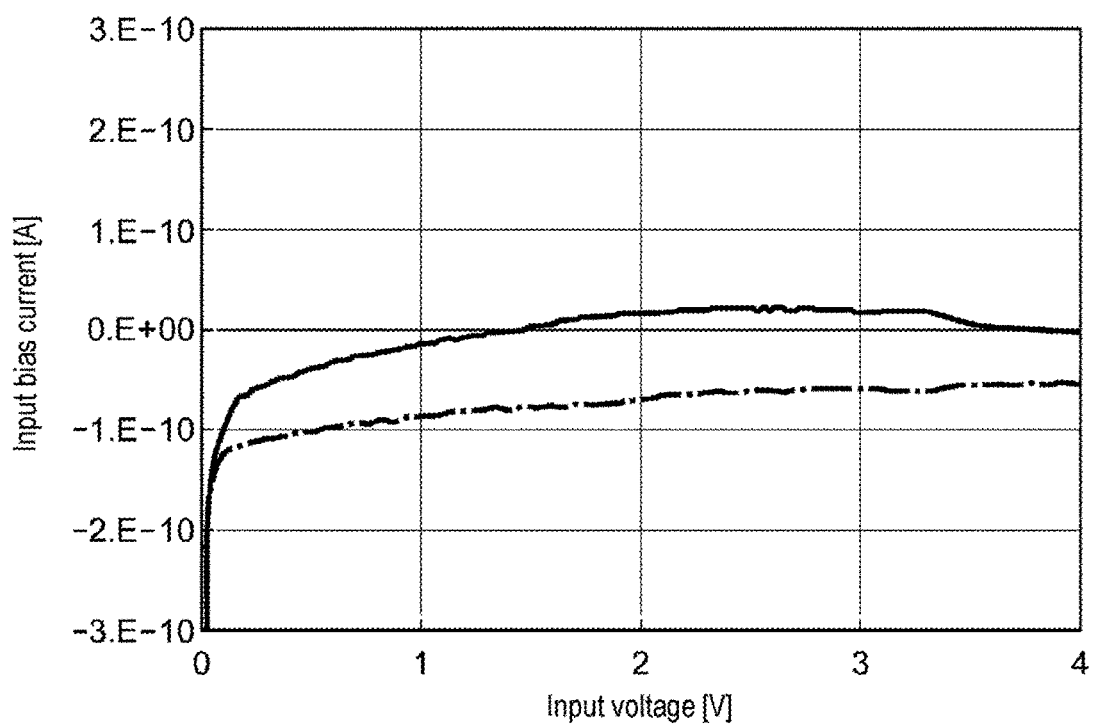

CHOPPER STABILIZED AMPLIFIER

CROSS-REFERENCE TO RELATED APPLICATION

This application is based upon and claims the benefit of priority from Japanese Patent Application No. 2018-050856, filed on Mar. 19, 2018, the entire contents of which are incorporated herein by reference.

TECHNICAL FIELD

The present disclosure relates to a chopper stabilized amplifier.

BACKGROUND

There is an input offset voltage as one of the characteristics of an operational amplifier. The input offset voltage (also simply referred to as an offset voltage) of an ideal operational amplifier is zero, but a realistic operational amplifier has a non-zero input offset voltage. As a method of setting the offset voltage to zero, there is a method of performing a trimming process so that the offset voltage becomes zero individually for each semiconductor chip at its manufacturing stage. However, such a trimming process is a factor in increasing the cost.

In order to cancel the offset voltage without trimming, there has been proposed an operational amplifier called a chopper stabilized amplifier or an auto zero amplifier. FIG. 1 is a circuit diagram of a chopper stabilized amplifier 200 reviewed by the present inventors.

The chopper stabilized amplifier 200 amplifies a potential difference between a voltage VP of a non-inverting input terminal (+) and a voltage VN of an inverting input terminal (−), and outputs an output signal $S_{OUT}$ corresponding to the potential difference from an output terminal OUT.

The chopper stabilized amplifier 200 includes a main amplifier 210 and two correction amplifiers 220 and 230. The main amplifier 210 includes a differential input stage 212 and an output stage 214. The differential input stage 212 is, for example, a gm amplifier (transconductance amplifier) and has a non-zero offset voltage $V_{OS1}$. The output stage 214 converts the differential output of the differential input stage 212 to single-ended.

The correction amplifiers 220 and 230, a current adding amplifier 240 and a plurality of switches SW21 to SW30 are provided to cancel the offset voltage $V_{OS1}$ of the main amplifier 210.

The plurality of switches SW21 to SW30 are alternately switched in response to a clock, assuming that the state shown in the figure is A and the state complementary thereto is B. In state A, the first correction amplifier 220 corrects the offset voltage $V_{OS1}$ and, in state B, the second correction amplifier 230 corrects the offset voltage $V_{OS1}$.

The correction amplifier 220 (230) includes a gm amplifier 222 (232) at the preceding stage and a gm amplifier 224 (234) at the subsequent stage.

The gm amplifier 222 at the preceding stage of the first correction amplifier 220 receives the voltage VP of the non-inverting input terminal (+) and the voltage VN of the inverting input terminal (−) in state A, and amplifies the potential difference between them. Output currents of the gm amplifier 222 are converted into voltages by capacitors C21 and C22 connected to its outputs, and then are input to the current adding amplifier 240 via the switches SW25 and SW26. The current adding amplifier 240 amplifies the voltages of the capacitors C21 and C22 and overlaps differential currents, which are its own output, with differential currents output from the differential input stage 212 of the main amplifier 210.

The gm amplifier 232 at the preceding stage of the second correction amplifier 230 receives the voltage VP of the non-inverting input terminal (+) and the voltage VN of the inverting input terminal (−) in state B, and amplifies the potential difference between them. Output currents of the gm amplifier 232 are converted into voltages by capacitors C23 and C24 connected to its outputs, and then are input to the current adding amplifier 240 via the switches SW25 and SW26. The current adding amplifier 240 amplifies the voltages of the capacitors C23 and C24 and overlaps differential currents, which are its own output, with the differential currents output from the differential input stage 212 of the main amplifier 210. By repeating states A and B, the offset voltage $V_{OS1}$ of the main amplifier 210 is canceled.

The gm amplifiers 222 and 232 used for correction also have non-zero offset voltages $V_{OS2}$ and $V_{OS3}$. In case that these values cannot be ignored, the offset voltage $V_{OS1}$ cannot be canceled accurately. In order to cancel the offset voltage $V_{OS2}$ ($V_{OS3}$) of the correction amplifier 220 (230) itself, the gm amplifier 224 (234) of the subsequent stage feedback-controls a bias current of the gm amplifier 222 (232) of the preceding stage such that the influence of the offset voltage $V_{OS2}$ ($V_{OS3}$) becomes zero.

Specifically, the offset voltage $V_{OS3}$ of the correction amplifier 230 is corrected in state A and the offset voltage $V_{OS2}$ of the correction amplifier 220 is corrected in state B. In state A, the potential difference of a differential input pair of the gm amplifier 232 becomes zero, and the voltages of the capacitors C23 and C24 connected to the output of the gm amplifier 232 have a potential difference according to the offset voltage $V_{OS3}$ at that time. The gm amplifier 234 of the subsequent stage corrects the gm amplifier 232 such that the potential difference between the capacitors C23 and C24 approaches zero.

The chopper stabilized amplifier 200 of FIG. 1 requires a plurality of correction amplifiers 220 and 230 and furthermore has a problem that their wirings are complicated and the circuit area becomes large.

FIG. 2 is a circuit diagram of a conventional chopper stabilized amplifier 1R disclosed in the related art. The chopper stabilized amplifier 1R is an operational amplifier having a non-inverting input pin INP (+), an inverting input pin INN (−), and an output terminal OUT.

A main amplifier 10 generates an output signal $S_{OUT}$ according to an error between a first voltage VP and a second voltage VN. The main amplifier 10 includes a first gm amplifier 12, which is provided as a differential input stage, and an output stage 14. The non-inverting input terminal of the first gm amplifier 12 is connected to the non-inverting input pin INP (+) and the inverting input terminal thereof is connected to the inverting input pin INN (−) for generating a first current signal $I_1$. The output stage 14 receives the first current signal $I_1$ and generates the output signal $S_{OUT}$ of the main amplifier 10.

The first gm amplifier 12 of the main amplifier 10 has an offset voltage $V_{OS1}$. A correction circuit 20 cancels the influence of the offset voltage $V_{OS1}$. The correction circuit 20 includes a second gm amplifier 22, an integration circuit 24, a first selector 30, a second selector 32, and a third gm amplifier 40. The second gm amplifier 22 of a full differential type amplifies a potential difference between the non-inverting input terminal (+) and the inverting input terminal (−) thereof, and outputs differential current signals $I_{3N}$ and $I_{3P}$ from the inverting output terminal (−) and the non-inverting output terminal (+) thereof, respectively.

The integration circuit 24 has a non-inverting input terminal (+) and an inverting input terminal (−). The integration circuit 24 integrates and samples/holds differential input currents $I_{4P}$ and $I_{4N}$ input thereto to generate differential voltage signals $V_{5P}$ and $V_{5N}$.

The integration circuit 24 includes an integrator 26 and a sample/hold circuit 28. The integrator 26 integrates the differential input currents $I_{4P}$ and $I_{4N}$ input to the non-inverting input terminal and the inverting input terminal of the integration circuit 24, respectively, to generate differential voltage signals $V_{6N}$ and $V_{6P}$. The sample/hold circuit 28 samples and holds the differential voltage signals $V_{6N}$ and $V_{6P}$ generated by the integrator 26 at predetermined cycles.

The first selector 30 is installed at a proceeding stage of the second gm amplifier 22. The first selector 30 switches between (i) a first state φ1 where the non-inverting input pin INP (+) and the inverting input pin INN (−) are connected with the inverting input terminal and the non-inverting input terminal of the second gm amplifier 22, respectively, and (ii) a second state φ2 where the non-inverting input pin INP (+) and the inverting input pin INN (−) are connected with the non-inverting input terminal and the inverting input terminal of the second gm amplifier 22, respectively. FIG. 2 shows the first state φ1. The first selector 30 includes a plurality of switches SW1 to SW4. Each switch may be a CMOS switch (CMOS transfer gate). The switches SW1 and SW2 are turned on in the first state φ1 and are turned off in the second state φ2. The switches SW3 and SW4 are turned off in the first state φ1 and are turned on in the second state φ2.

The second selector 32 is installed at a subsequent stage of the second gm amplifier 22. The second selector 32 switches between (i) a first state φ1 where the inverting output terminal (−) and the non-inverting input terminal (+) of the second gm amplifier 22 are connected with the inverting input terminal (−) and the non-inverting input terminal (+) of the integration circuit 24, respectively, and (ii) a second state φ2 where the inverting output terminal (−) and the non-inverting input terminal (+) of the second gm amplifier 22 are connected with the non-inverting input terminal (+) and the inverting input terminal (−) of the integration circuit 24, respectively. The second selector 32 includes a plurality of switches SW5 to SW8. Each switch may be a CMOS switch (CMOS transfer gate). The switches SW5 and SW6 are turned on in the first state φ1 and are turned off in the second state φ2. The switches SW7 and SW8 are turned off in the first state φ1 and are turned on in the second state φ2.

The third gm amplifier 40 converts the differential voltage signals $V_{5P}$ and $V_{5N}$ generated by the integration circuit 24 into a second current signal $I_2$, and then overlaps the second current signal $I_2$ with the first current signal $I_1$. In the present embodiment, both the first gm amplifier 12 and the third gm amplifier 40 are of a full differential type, and the differential second current signals $I_{2P}$ and $I_{1N}$ are overlapped with the differential first current signals $I_{1P}$ and $I_{2N}$.

The input of the second gm amplifier 22 is biased to a predetermined voltage $V_{COM2}$ via resistors R21 and R22. A third capacitor C3 and a fourth capacitor C4 for DC blocking are installed between the first selector 30 and the second gm amplifier 22.

The above is the basic configuration of the chopper stabilized amplifier 1R. Subsequently, the operation thereof will be described. The first selector 30 and the second selector 32 are switched based on a common first clock signal (also referred to as a chopper clock) $CK_A$, thereby alternating between the first state φ1 and the second state φ2.

The correction circuit 20 modulates the offset voltage $V_{OS1}$ of the first gm amplifier 12 by the switching operation of the first state φ1 and the second state φ2 and takes it into the integration circuit 24. At this time, a DC component is removed by the capacitors C3 and C4. Here, in the first state φ1, the first voltage VP reaches the non-inverting input terminal of the integration circuit 24 via the switch SW1, the capacitor C4, the second gm amplifier 22, and the switch SW6. Similarly, in the second state φ2, the first voltage VP reaches the non-inverting input terminal of the integration circuit 24 via the switch SW3, the capacitor C3, the second gm amplifier 22 and the switch SW7. The second voltage VN is opposite to the first voltage VP and reaches the inverting input terminal of the integration circuit 24 in both the first state φ1 and the second state φ2. That is, by passing through the first selector 30 and the second selector 32, the offset voltage $V_{OS1}$ is taken into the integration circuit 24 with the same polarity in both the first state φ1 and the second state φ2.

Then, the third gm amplifier 40 can cancel the offset voltage $V_{OS1}$ by overlapping the second current signal $I_2$ corresponding to the offset voltage $V_{OS1}$ with the first current signal $I_1$.

The correction circuit 20 also takes the offset voltage $V_{OS2}$ of the second gm amplifier 22 into the integration circuit 24 by the switching operation of the first state φ1 and the second state φ2. Here, when focusing on one output current $I_{3N}$ of the second gm amplifier 22, in the first state φ1, the output current $I_{3N}$ reaches the inverting input terminal of the integration circuit 24 via the switch SW5, but in the second state φ2, the output current $I_{3N}$ reaches the non-inverting input terminal of the integration circuit 24 via the switch SW7. When focusing on the other output current $I_{3P}$, in the first state φ1, the output current $I_{3P}$ reaches the non-inverting input terminal of the integration circuit 24 via the switch SW6, but in the second state φ2, the output current $I_{3P}$ reaches the inverting input terminal of the integration circuit 24 via the switch SW8. That is, only by passing through the second selector 32, the offset voltage $V_{OS2}$ of the second gm amplifier 22 is taken into the integration circuit 24 in an opposite polarity in the first state φ1 and the second state φ2.

That is, by repeating the first state φ1 and the second state φ2, the components corresponding to the offset voltage $V_{OS2}$ are alternately integrated with the opposite polarity, so that only the component of the offset voltage $V_{OS1}$ appears in the outputs $V_{5P}$ and $V_{5N}$ of the integration circuit 24. That is, according to the correction circuit 20 of FIG. 2, the gm amplifier 224 (234) in the subsequent stage as shown in FIG. 1 is unnecessary in order to cancel the offset voltage $V_{OS2}$, and the circuit can be accordingly simplified.

FIG. 3A is a waveform diagram showing an example of the operation of the chopper stabilized amplifier 1R of FIG. 2. The first selector 30 and the second selector 32 are controlled based on the first clock signal $CK_A$. The integration circuit 24 is controlled to be in a hold state at an edge timing of the first clock signal $CK_A$. In addition, the integration circuit 24 is controlled so as to perform a sampling operation in a period during which the first clock signal $CK_A$ is stable.

By setting the sampling operation and the holding operation of the integration circuit 24 and the timing of the switching operations of the first selector 30 and the second selector 32 in this manner, a noise caused by the first clock signal $CK_A$ for chopper can be prevented from being mixed in the second current signal $I_2$.

For example, the integration circuit 24 may be controlled based on a second clock signal $CK_B$. In this example, the integration circuit 24 is in a hold state $\varphi_H$ in a period during which the second clock signal $CK_B$ is at a first level, and the edge E1 just before the hold state $\varphi_H$ may be used as a sampling timing. The edge of the first clock signal $CK_A$ and the edge of the second clock signal $CK_B$ are temporally shifted so as not to overlap with each other. As a result, it is possible to prevent a noise caused by the first clock signal $CK_A$ from being mixed into the main amplifier 10.

The cycle $T_B$ of the second clock signal $CK_B$ may be an integer multiple, for example, twice the cycle $T_A$ of the first clock signal $CK_A$. The edge of the second clock signal $CK_B$ is shifted from the edge of the first clock signal $CK_A$ by ⅛ of the cycle $T_B$. This is because the interval between the edges becomes maximum when the shift amount $\delta T=T_B/8$ in case that $T_B=T_A\times 2$, so that it becomes most difficult to mix a noise. However, the combination of the relationship of frequency and the shift amount $\delta T$ is not limited thereto.

FIG. 3B illustrates clocks $CK_1$ and $CK_2$ used in the chopper stabilized amplifier 200 of FIG. 1 for comparison. For example, a switch group including the switches SW21, SW24, SW29, and SW30 and the switches SW25 and SW26, which are shown as ON in FIG. 1, are switched in response to the clock $CK_1$, and a switch group including the switches SW22, SW23, SW27, and SW0 and the switches SW25 and SW26, which are shown as OFF in FIG. 1, are switched in response to the clock $CK_2$, In the chopper stabilized amplifier 200 of FIG. 1, a pair of non-overlap clocks as shown in FIG. 3B is used to prevent simultaneous ON of the switches and to prevent leakage of charges from the capacitors or the like. However, since it is not possible in principle to enlarge the interval between the edges of the two clocks $CK_1$ and $CK_2$ to such an extent, a chopper noise is mixed in the main amplifier 210.

In contrast, according to the chopper stabilized amplifier 1R of FIG. 2, since there is no need to use a non-overlapping clock, the influence of the chopper noise can be greatly reduced as compared with FIG. 1.

As a result of examining the chopper stabilized amplifier 1R of FIG. 2, the present inventors have recognized the following problems.

FIG. 4A is an operation waveform diagram of the chopper stabilized amplifier 1R of FIG. 2. By the switching operation of the first selector 30, the voltage VP and the voltage VN are alternately generated at one end (node A) of the capacitor C3. Then, the voltage at the other end (node C) of the capacitor C3 is changed as much as the variation of the voltage of the node A around the bias voltage $V_{COM2}$. The same applies to the nodes B and D side. By the switching operation of the first selector 30, a current flows through the capacitor C3 (C4). The temporal mean (i.e., the DC component) of a current flowing through the input terminal INP (INN) is non-zero, and an offset input bias current is generated.

FIG. 4B is a diagram showing a relationship between the input voltage and the input bias current of the chopper stabilized amplifier 1R of FIG. 2. The input bias current fluctuates within a range of several pA (picoampere) to several hundred pA.

SUMMARY

Some embodiments of the present disclosure provide a chopper stabilizing amplifier with a reduced input bias current.

According to one embodiment of the present disclosure, there is provided a chopper stabilized amplifier including: a non-inverting input pin configured to receive a first voltage; an inverting input pin configured to receive a second voltage; a main amplifier configured to generate an output signal according to an error between the first voltage and the second voltage; and a correction circuit. The main amplifier includes: a first gm amplifier installed as a differential input stage and configured to generate a first current signal, the first gm amplifier having a non-inverting input terminal connected to the non-inverting input pin and an inverting input terminal connected to the inverting input pin; and an output stage configured to receive the first current signal and generate the output signal of the main amplifier. The correction circuit includes: a second gm amplifier of a full differential type configured to amplify a potential difference between a non-inverting input terminal and an inverting input terminal and output a differential current signal from an inverting output terminal and a non-inverting output terminal; an integration circuit configured to integrate a differential input current which is input to a non-inverting input terminal and an inverting input terminal, sample/hold the integrated differential input current at a predetermined cycle, and generate a differential voltage signal; a first selector installed at a preceding stage of the second gm amplifier and configured to switch between (i) a first state where the non-inverting input pin and the inverting input pin are connected with the inverting input terminal and the non-inverting input terminal of the second gm amplifier, respectively, and (ii) a second state where the non-inverting input pin and the inverting input pin are connected with the non-inverting input terminal and the inverting input terminal of the second gm amplifier, respectively; a second selector installed at a subsequent stage of the second gm amplifier and configured to switch between (i) a first state where the inverting output terminal and the non-inverting input terminal of the second gm amplifier are connected with the inverting input terminal and the non-inverting input terminal of the integration circuit, respectively, and (ii) a second state where the inverting output terminal and the non-inverting input terminal of the second gm amplifier are connected with the non-inverting input terminal and the inverting input terminal of the integration circuit, respectively; and a third gm amplifier configured to convert the differential voltage signal generated by the integration circuit into a second current signal and overlap the second current signal with the first current signal. The second gm amplifier has a depletion-type differential input pair.

According to one embodiment of the present disclosure, the circuit configuration can be simplified as compared with the chopper stabilized amplifier of FIG. 1. In addition, since a capacitor for coupling is unnecessary between the first selector and the second gm amplifier, the input offset current can be reduced and the circuit area can be reduced.

The integration circuit may include an integrator configured to generate the differential voltage signal by integrating the differential input current input to the non-inverting input terminal and the inverting input terminal; and a sample/hold circuit configured to sample/hold the differential voltage signal generated by the integrator.

Both the first gm amplifier and the third gm amplifier may be of a full differential type, and the second current signal that is differential may be overlapped with the first current signal that is differential.

The first selector and the second selector may be controlled based on a first clock signal.

The integration circuit may be controlled to be in a hold state at an edge timing of the first clock signal. Thereby, it is possible to suppress a noise caused by the first clock signal from being propagated to the main amplifier.

The integration circuit may be controlled to perform a sampling operation in a period during which the first clock signal is stable. Thereby, it is possible to suppress a noise caused by the first clock signal from being propagated to the main amplifier.

The integration circuit may be controlled based on a second clock signal, and an edge of the first clock signal and an edge of the second clock signal may be shifted.

The second clock signal may be an integer multiple cycle $T_B$ of the first clock signal. In such a case, the first clock signal and second clock signal may be easily generated by using a frequency divider or a multiplier.

The second clock signal may be a cycle $T_B$ that is double the first clock signal. The edge of the second clock signal is shifted from the edge of the first clock signal by ⅛ of the cycle $T_B$.

The second gm amplifier may include a first transistor and a second transistor that are depletion-type Metal Oxide Semiconductor Field Effect Transistors (MOSFETs) whose sources are connected in common to a tail current source, and output currents flowing through the first transistor and the second transistor, respectively.

The integrator may include a third MOSFET having a source connected to a fixed voltage line and a gate to which one current signal in a differential type current signal pair is input from the second selector, a fourth MOSFET having a source connected to the fixed voltage line and a gate to which the other current signal in the differential type current signal pair is input from the second selector, a first capacitor installed between the gate and a drain of the third MOSFET, and a second capacitor installed between the gate and a drain of the fourth MOSFET.

According to one embodiments of the present disclosure, the chopper stabilized amplifier may include a common mode feedback circuit configured to adjust a bias state of the second gm amplifier such that a midpoint voltage between two output voltages of the integrator approaches a target voltage.

As the chopper stabilized amplifier is integrated on a single semiconductor substrate, a circuit area can be reduced and the characteristics of the circuit elements can be uniformly maintained.

BRIEF DESCRIPTION OF DRAWINGS

FIG. 3A is a waveform diagram showing an example of the operation of the chopper stabilized amplifier of FIG. 2.

FIG. 3B is a diagram showing clocks $CK_1$ and $CK_2$ used in the chopper stabilized amplifier of FIG. 1.

FIG. 4A is an operation waveform diagram of the chopper stabilized amplifier of FIG. 2.

FIG. 7 is a diagram showing a relationship between an input voltage and an input bias current of the chopper stabilized amplifier of FIG. 5.

DETAILED DESCRIPTION

Figure 1:
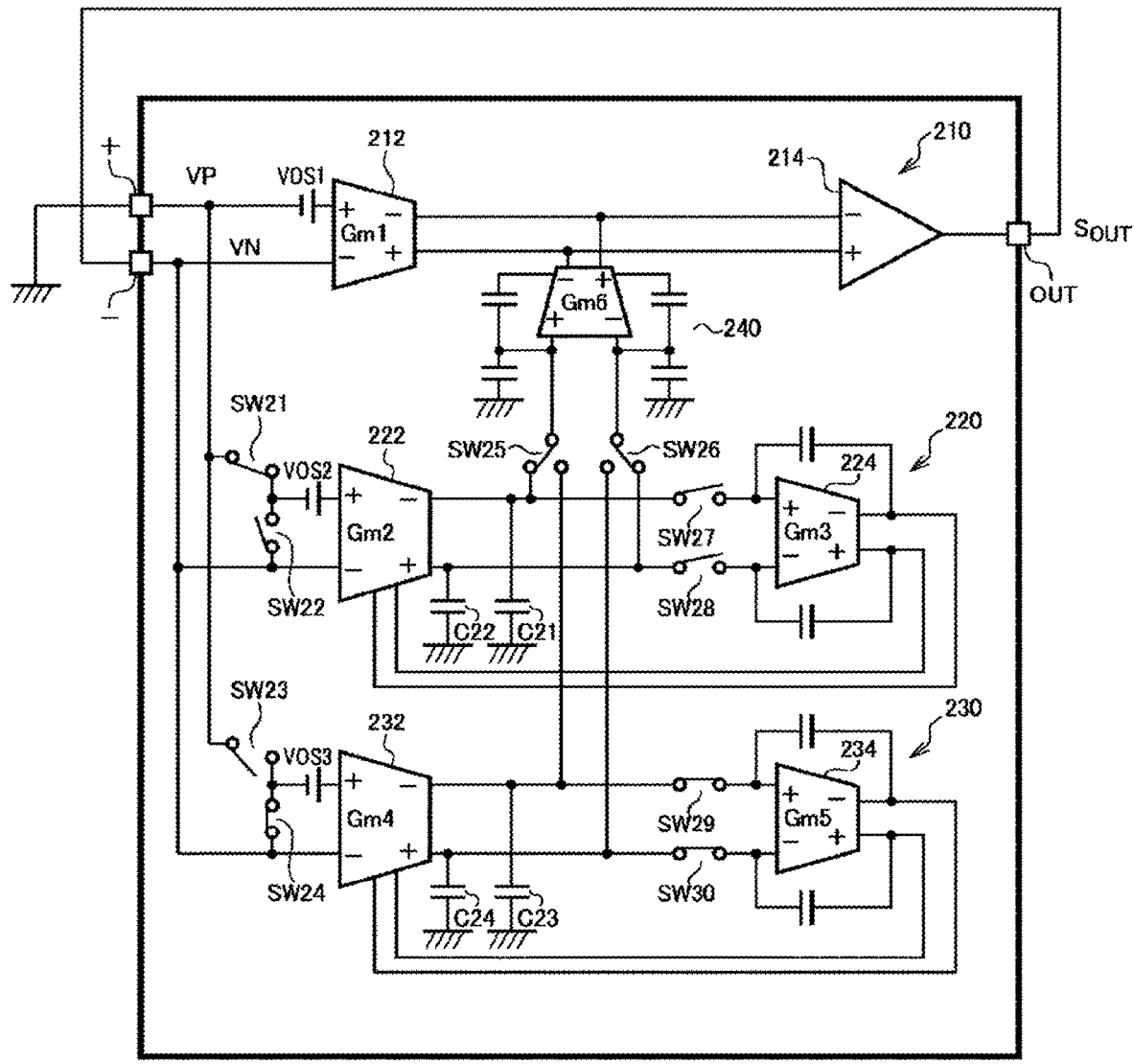
FIG. 1 is a circuit diagram of a chopper stabilized amplifier reviewed by the present inventors.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

In the present disclosure, "a state where a member A is connected to a member B" includes a case where the member A and the member B are physically directly connected or even a case where the member A and the member B are indirectly connected through any other member that does not affect an electrical connection state between the members A and B or does not impair functions and effects achieved by combinations of the members A and B.

Similarly, "a state where a member C is installed between a member A and a member B" includes a case where the member A and the member C or the member B and the member C are indirectly connected through any other member that does not affect an electrical connection state between the members A and C or the members B and C or does not impair function and effects achieved by combinations of the members A and C or the members B and C, in addition to a case where the member A and the member C or the member B and the member C are directly connected.

Figure 5:
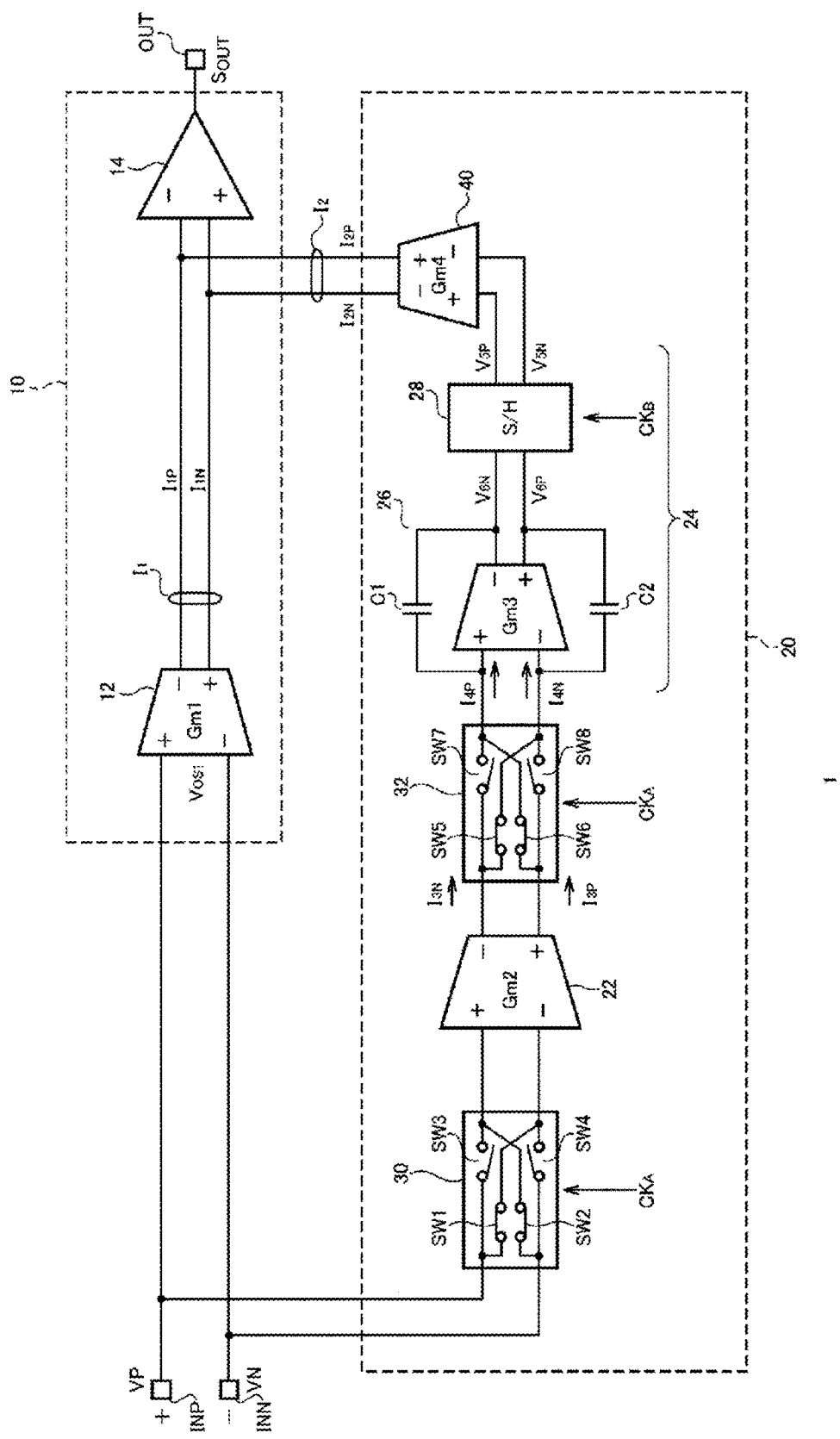
FIG. 5 is a circuit diagram of a chopper stabilized amplifier according to an embodiment.

FIG. 5 is a circuit diagram of a chopper stabilized amplifier 1 according to an embodiment. The chopper stabilized amplifier 1 of FIG. 5 is obtained by removing the capacitors C3 and C4 from the chopper stabilized amplifier 1R of FIG. 2. Further, a differential input pair of a second gm amplifier 22 is configured with depletion-type transistors instead of the generally used enhancement-type transistors.

Figure 6:
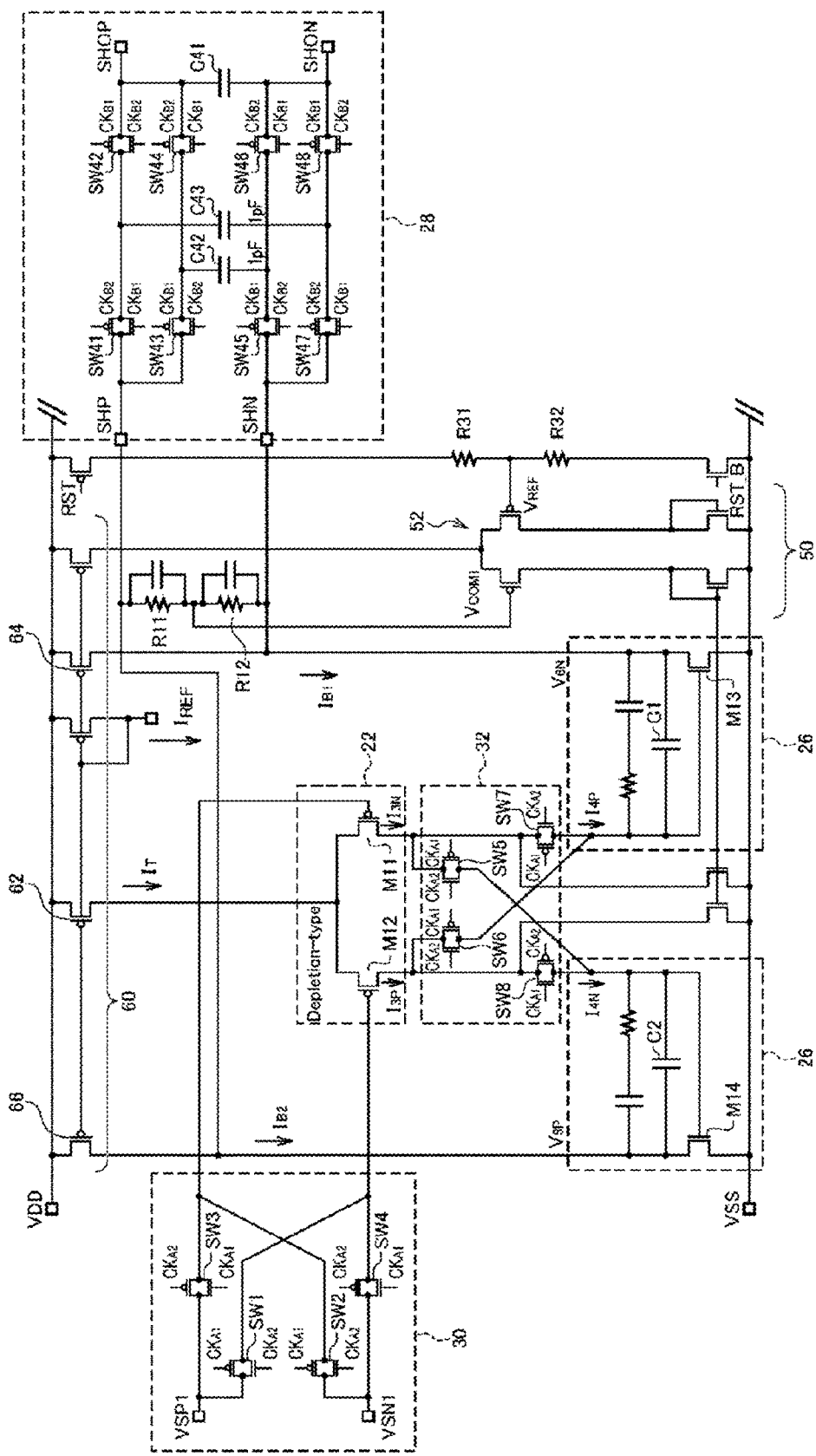
FIG. 6 is a circuit diagram showing a configuration example of a correction circuit.

FIG. 6 is a circuit diagram showing a configuration example of the correction circuit 20. The third gm amplifier 40 is not shown in FIG. 6.

A current mirror circuit 60 receives a reference current $I_{REF}$ as an input and generates a plurality of currents proportional to the reference current $I_{REF}$. The current mirror circuit 60 includes a tail current source 62 and constant current sources 64 and 66.

The second gm amplifier 22 includes a first transistor M11 and a second transistor M12, which are a differential input pair. The first transistor M11 and the second transistor M12 are depletion-type PMOS transistors whose sources are connected to a tail current source 62 and to which a tail current $I_T$ is supplied. A current flowing through the first transistor M11 corresponds to the current $I_{3N}$ in FIG. 2 and a current flowing through the second transistor M12 corresponds to the current $I_{3P}$ in FIG. 2.

An integrator 26 mainly includes third and fourth transistors M13 and M14, which are NMOS transistors, and first and second capacitors C1 and C2. The sources of the third and fourth transistors M13 and M14 are connected to a fixed voltage line (ground line). A pair of differential type current signals $I_{4P}$ and $I_{4N}$ from the second selector 32 is input to the gates of the third transistor M13 and the fourth transistor M14, respectively. The first capacitor C1 is installed between the gate and the drain of the third transistor M13 and the second capacitor C2 is installed between the gate and the drain of the fourth transistor M14. The third transistor M13 and the fourth transistor M14 are biased with equal currents $I_{B1}$ and $I_{B2}$ by the constant current sources 64 and 66, respectively.

A common mode feedback circuit 50 adjusts the bias state of the second gm amplifier 22 such that a midpoint voltage $V_{COM1}$ between the two output voltages $V_{6P}$ and $V_{6N}$ of the integrator 26 approaches the target voltage $V_{REF}$. That is, the midpoint voltage $V_{COM1}$ of the output voltages $V_{6P}$ and $V_{6N}$ is generated by resistors R11 and R12. Further, the midpoint voltage $V_{REF}$ between the power supply voltage VDD and the ground voltage VSS is generated by resistors R31 and R32 and is supplied to one input terminal of a differential amplifier 52.

Figure 4B:
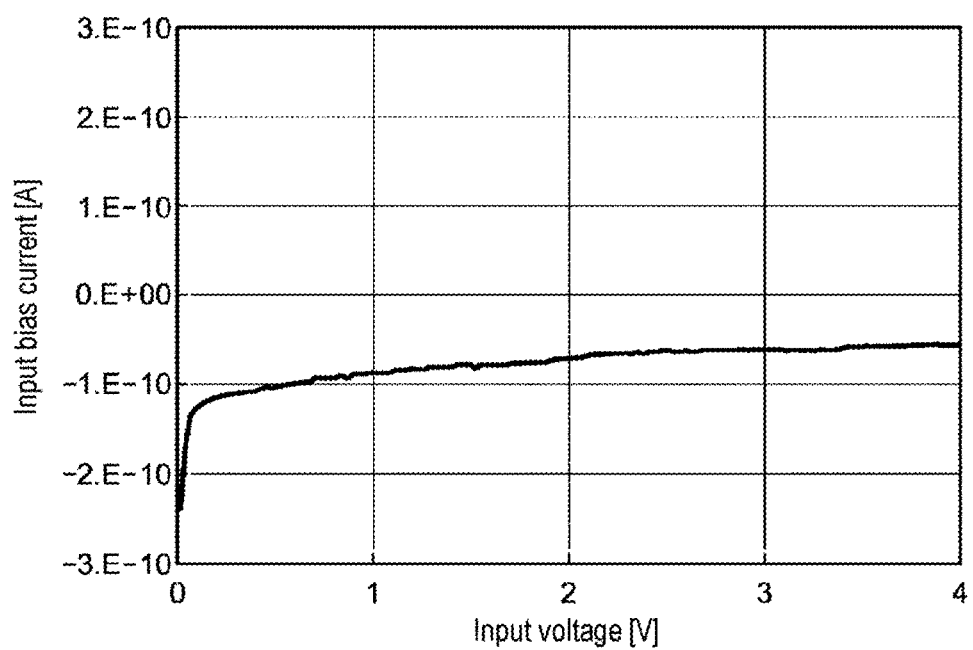
FIG. 4B is a diagram showing a relationship between an input voltage and an input bias current of the chopper stabilized amplifier of FIG. 2.

The sample/hold circuit 28 includes switches SW41 to SW48 and capacitors C41, C42, and C43. Each switch of FIG. 4 is a CMOS switch (transfer gate), and NMOS and PMOS transistors are controlled by complementary clocks $CK_{A1}$ and $CK_{A2}$ ($CK_{B1}$ and $CK_{B2}$). Each clock signal is shown in FIG. 3A.

The above is a configuration of the chopper stabilized amplifier 1 according to the embodiment. Subsequently, the advantages thereof will be described.

Figure 2:
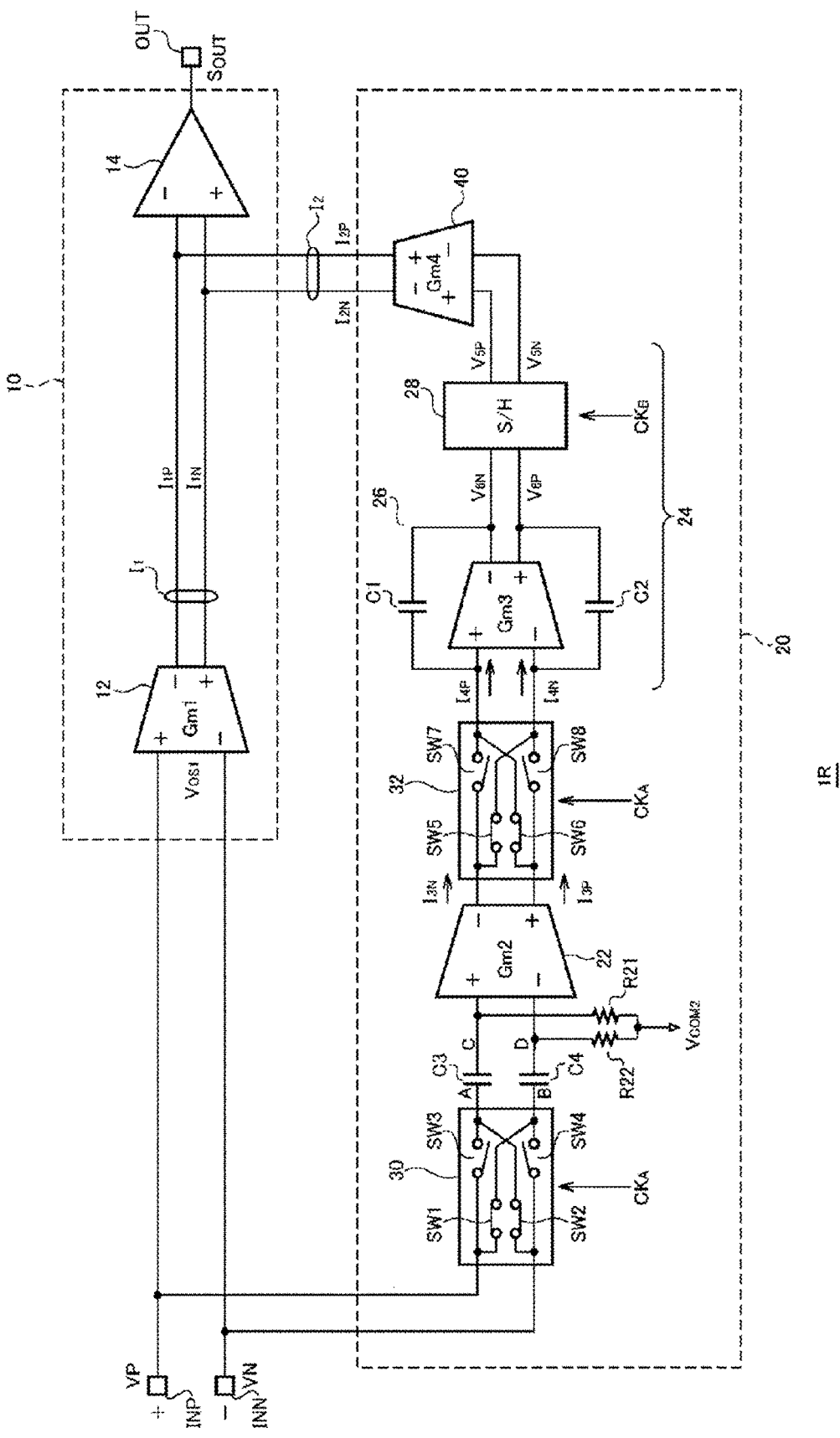
FIG. 2 is a circuit diagram of a conventional chopper stabilized amplifier.

FIG. 7 is a diagram showing a relationship between the input voltage and the input bias current of the chopper stabilized amplifier 1 of FIG. 5. The characteristics of the chopper stabilized amplifier 1 of FIG. 5 are indicated by a solid line, and the characteristics of the conventional chopper stabilized amplifier 1R shown in FIG. 2 are indicated by an alternate long-and-short dashed line, for comparison. According to the chopper stabilized amplifier 1 of FIG. 5, since the DC blocking capacitors C3 and C4 of FIG. 2 are omitted, the input bias current can be reduced. Specifically, the input bias current is −110 pA to −60 pA in the conventional chopper stabilized amplifier 1R, whereas the input bias current is reduced to −50 pA to 10 pA in the chopper stabilized amplifier 1 of FIG. 5.

In addition, the capacitors C3 and C4 are unnecessary, and the circuit area can be reduced. Assuming that the capacitance value of each capacitor is 20 pF, the capacitance of 40 pF in total can be reduced. Further, the capacitors affect a semiconductor manufacturing process, and their area is about 90 μm×450 μm so that the effect on the chip area is not small. The capacitance values of the capacitors C3 and C4 are designed according to the chopper frequency. The capacitance values of the capacitors C3 and C4 may be several hundreds of pF according to the chopper frequency, and the larger capacitance values show more remarkable reduction in the chip area.

In the related art, it is necessary to design the capacitance values of the capacitors C3 and C4 according to the circuit operation frequency (chopper frequency). In contrast, with the chopper stabilized amplifier 1 according to the embodiment, it is possible to design a circuit independent from the chopper frequency.

Further, since the resistors R21 and R22 for bias are unnecessary, the circuit area can be further reduced. For example, when the resistors R21 and R22 are composed of a combination of four resistors of 500 kΩ, their area is about 50 μm×20 μm, thereby contributing to a reduction in the chip area though not as large as the capacitors.

Figure 8A:
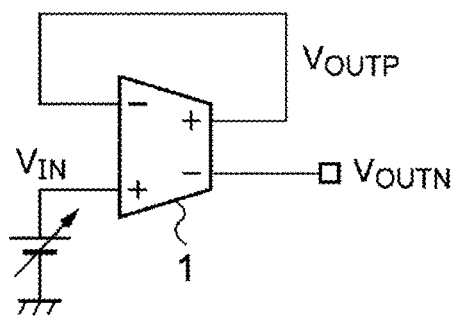
FIG. 8A is a circuit diagram of a voltage follower circuit using a chopper stabilized amplifier.
Figure 8B:
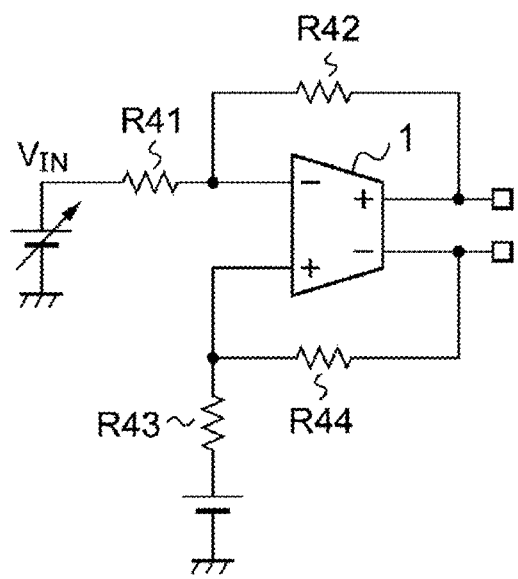
FIG. 8B is a circuit diagram of a differential amplifier using a chopper stabilized amplifier.
Figure 9A:
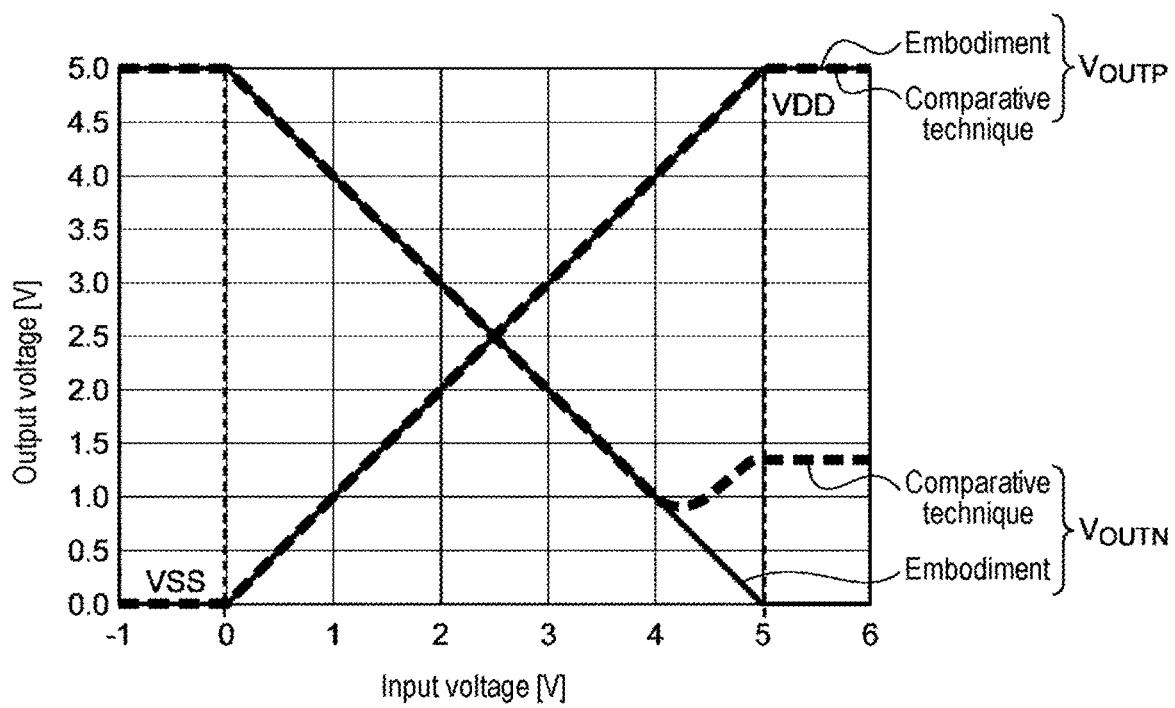
FIG. 9A is a diagram showing input/output characteristics of the voltage follower circuit of FIG. 8A.

Subsequently, further advantages of the chopper stabilized amplifier 1 will be described. Simulation results of evaluating the characteristics of several circuits constructed by using the chopper stabilized amplifier 1 will be described. FIG. 8A is a circuit diagram of a voltage follower circuit using the chopper stabilized amplifier 1, and FIG. 8B is a circuit diagram of a differential amplifier using the chopper stabilized amplifier 1. FIG. 9A is a diagram showing input/output characteristics of the voltage follower circuit of FIG. 8A, and FIG. 9B is a diagram showing input/output characteristics of the differential amplifier of FIG. 8B.

Figure 9B:
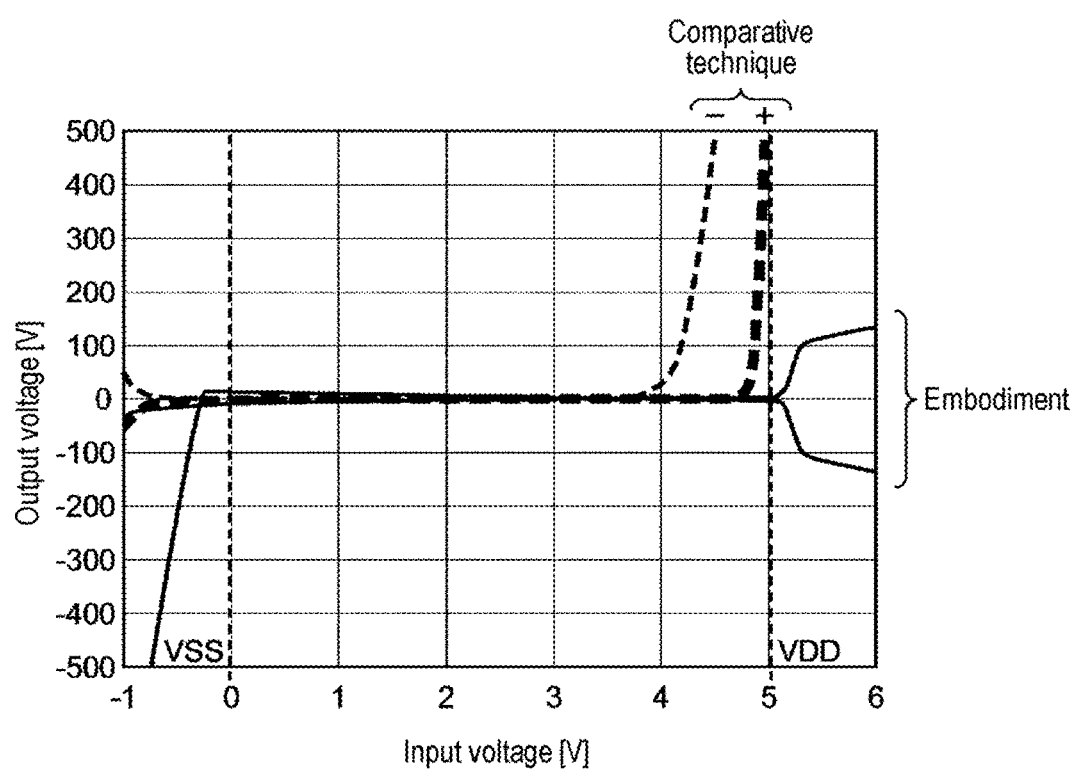
FIG. 9B is a diagram showing input/output characteristics of the differential amplifier of FIG. 8B.

In FIG. 9A and FIG. 9B, the characteristics of the chopper stabilized amplifier 1 according to the embodiment are indicated by a solid line, whereas the characteristics of a comparative technique are indicated by a broken line. The comparative technique is a circuit in which the differential input pair of the second gm amplifier 22 is configured as an enhancement type in the configuration of FIG. 5.

As shown in FIG. 9A, in the comparative technique using the enhancement type, when the input voltage $V_{IN}$ exceeds 4V, the inverted output $V_{OUTN}$ deviates from the ideal characteristics. In contrast, in the embodiment using the depletion type, the inverted output $V_{OUTN}$ maintains the ideal characteristics within the full range of 0 to 5V.

In addition, as shown in FIG. 9B, in the comparative technique using the enhancement type, when the input voltage $V_{IN}$ exceeds 3.9V, the offset voltage increases. In contrast, in the embodiment using the depletion type, the offset voltage can be brought close to zero within the full range of 0 to 5V.

The present disclosure has been described above by way of embodiments. The disclosed embodiments are exemplary only and it should be understood by those skilled in the art that various modifications to combinations of elements or processes may be made and such modifications fall within the scope of the present disclosure. Such modifications will be described below.

(First Modification)

It has been illustrated in the embodiment that both the first gm amplifier 12 and the third gm amplifier 40 have a differential output type. However, their outputs may be single-ended. In this case, by setting the output of the third gm amplifier 40 to a push-pull type, the positive/negative offset voltage $V_{OS1}$ can be cancelled.

(Second Modification)

The configuration of the integration circuit 24 is not limited to that shown in FIG. 2. For example, the sample/hold circuit 28 may be integrated with the integrator 26. A circuit in which the integrator and the sample/hold circuit are integrated is often used in the field of sensors and the like to utilize the technique thereof.

(Third Modification)

Figure 10:
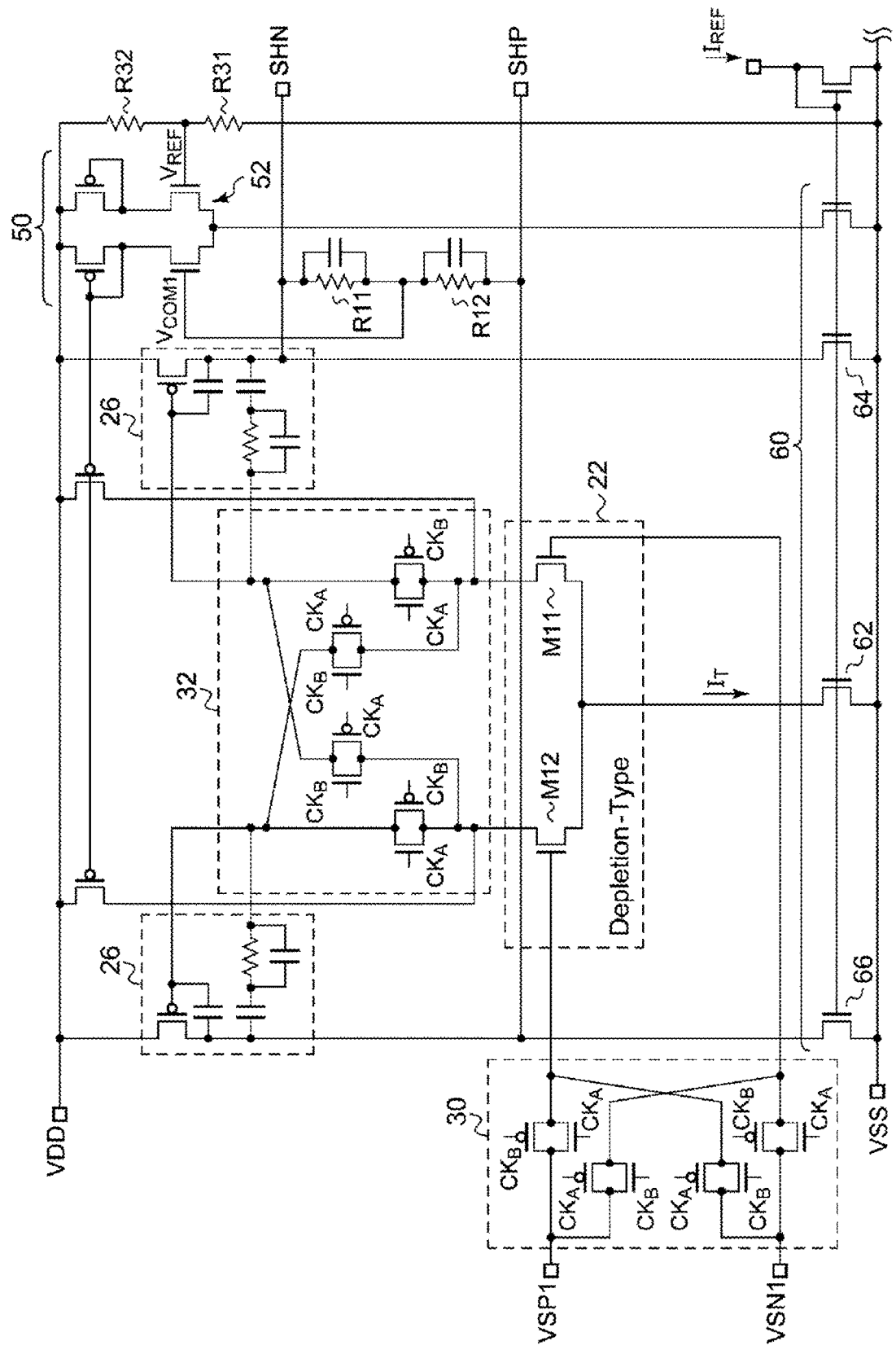
FIG. 10 is a circuit diagram of a correction circuit according to a modification.

FIG. 10 is a circuit diagram of the correction circuit 20 according to a modified embodiment. The correction circuit 20 may be understood as a configuration in which the top and bottom are inverted by exchanging the P channel transistor and the N channel transistor of the correction circuit 20 of FIG. 6.

According to the present disclosure in some embodiments, it is possible to provide a chopper stabilized amplifier with a more simplified configuration.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A chopper stabilized amplifier comprising:
    a non-inverting input pin configured to receive a first voltage;
    an inverting input pin configured to receive a second voltage;
    a main amplifier configured to generate an output signal according to an error between the first voltage and the second voltage; and
    a correction circuit,
    wherein the main amplifier includes:
        a first gm amplifier installed as a differential input stage and configured to generate a first current signal, the first gm amplifier having a non-inverting input terminal connected to the non-inverting input pin and an inverting input terminal connected to the inverting input pin; and
        an output stage configured to receive the first current signal and generate the output signal of the main amplifier,
    wherein the correction circuit includes:
        a second gm amplifier of a full differential type configured to amplify a potential difference between a non-inverting input terminal and an inverting input terminal and output a differential current signal from an inverting output terminal and a non-inverting output terminal;
        an integration circuit configured to integrate a differential input current which is input to a non-inverting input terminal and an inverting input terminal, sample/hold the integrated differential input current at a predetermined cycle, and generate a differential voltage signal;
        a first selector installed at a preceding stage of the second gm amplifier and configured to switch between (i) a first state where the non-inverting input pin and the inverting input pin are connected with the inverting input terminal and the non-inverting input terminal of the second gm amplifier, respectively, and (ii) a second state where the non-inverting input pin and the inverting input pin are connected with the non-inverting input terminal and the inverting input terminal of the second gm amplifier, respectively;
        a second selector installed at a subsequent stage of the second gm amplifier and configured to switch between (i) a first state where the inverting output terminal and the non-inverting input terminal of the second gm amplifier are connected with the inverting input terminal and the non-inverting input terminal of the integration circuit, respectively, and (ii) a second state where the inverting output terminal and the non-inverting input terminal of the second gm amplifier are connected with the non-inverting input terminal and the inverting input terminal of the integration circuit, respectively; and
        a third gm amplifier configured to convert the differential voltage signal generated by the integration circuit into a second current signal and overlap the second current signal with the first current signal, and
    wherein the second gm amplifier has a depletion-type differential input pair.

2. The chopper stabilized amplifier of claim 1, wherein the integration circuit includes:
    an integrator configured to generate the differential voltage signal by integrating the differential input current input to the non-inverting input terminal and the inverting input terminal; and
    a sample/hold circuit configured to sample/hold the differential voltage signal generated by the integrator.

3. The chopper stabilized amplifier of claim 1, wherein both the first gm amplifier and the third gm amplifier are of a full differential type, and the second current signal that is differential is overlapped with the first current signal that is differential.

4. The chopper stabilized amplifier of claim 1, wherein the first selector and the second selector are controlled based on a first clock signal.

5. The chopper stabilized amplifier of claim 4, wherein the integration circuit is controlled to be in a hold state at an edge timing of a second clock signal.

6. The chopper stabilized amplifier of claim 4, wherein the integration circuit is controlled to perform a sampling operation in a period during which the first clock signal is stable.

7. The chopper stabilized amplifier of claim 1, wherein the second gm amplifier includes a first transistor and a second transistor that are depletion-type Metal Oxide Semiconductor Field Effect Transistors (MOSFETs) whose sources are connected in common to a tail current source, and outputs currents flowing through the first transistor and the second transistor, respectively.

8. The chopper stabilized amplifier of claim 2, wherein the integrator includes:
    a third MOSFET having a source connected to a fixed voltage line and a gate to which one current signal in a differential type current signal pair is input from the second selector;
    a fourth MOSFET having a source connected to the fixed voltage line and a gate to which the other current signal in the differential type current signal pair is input from the second selector;
    a first capacitor installed between the gate and a drain of the third MOSFET; and
    a second capacitor installed between the gate and a drain of the fourth MOSFET.

9. The chopper stabilized amplifier of claim 2, further comprising a common mode feedback circuit configured to adjust a bias state of the second gm amplifier such that a midpoint voltage between two output voltages of the integrator approaches a target voltage.

10. The chopper stabilized amplifier of claim 1, wherein the chopper stabilized amplifier is integrated on a single semiconductor substrate.

* * * * *